United States Patent
Yeh

(10) Patent No.: US 10,162,747 B2
(45) Date of Patent: Dec. 25, 2018

(54) DATA WRITING METHOD, MEMORY CONTROL CIRCUIT UNIT AND MEMORY STORAGE APPARATUS

(71) Applicant: PHISON ELECTRONICS CORP., Miaoli (TW)

(72) Inventor: Chih-Kang Yeh, Kinmen County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 14/557,422

(22) Filed: Dec. 1, 2014

(65) Prior Publication Data

US 2016/0117244 A1 Apr. 28, 2016

(30) Foreign Application Priority Data

Oct. 27, 2014 (TW) .............................. 103136997 A

(51) Int. Cl.
*G06F 12/02* (2006.01)
*G11C 16/28* (2006.01)
(Continued)

(52) U.S. Cl.
CPC ........ *G06F 12/0246* (2013.01); *G11C 7/1006* (2013.01); *G11C 16/10* (2013.01);
(Continued)

(58) Field of Classification Search
CPC ........... G06F 12/246; G06F 2212/7205; G11C 16/28; G11C 7/1006; G11C 16/10; G11C 16/32; G11C 16/3495; G11C 2207/102
See application file for complete search history.

(56) References Cited

U.S. PATENT DOCUMENTS 6,732,302 B1 * 5/2004 Palenius ............... H04L 1/0046
714/25
2006/0007826 A1 * 1/2006 Hwang ................ G11B 27/329
369/53.2
(Continued)

FOREIGN PATENT DOCUMENTS

| CN | 102760099 | 10/2012 |
| CN | 103346800 | 10/2013 |
| TW | 201243590 | 11/2012 |

OTHER PUBLICATIONS

"Office Action of Taiwan Counterpart Application", dated Mar. 11, 2016, p. 1-p. 5.

(Continued)

*Primary Examiner* — Larry T Mackall
(74) *Attorney, Agent, or Firm* — JCIPRNET

(57) ABSTRACT

A data writing method for a rewritable non-volatile memory module is provided. The method includes: compressing data to generate first data; determining whether a data length of the first data meets a predetermined condition. The method also includes: if the data length of the first data meets the predetermined condition, writing the first data into a first physical erasing unit among a plurality of physical erasing units; if the data length of the first data does not meet the predetermined condition, generating dummy data according to a predetermined rule, padding the first data with the dummy data to generate second data and writing the second data into the first physical erasing unit. A data length of the second data meets the predetermined condition.

9 Claims, 10 Drawing Sheets

(51) Int. Cl.
*G11C 7/10* (2006.01)
*G11C 16/10* (2006.01)
*G11C 16/32* (2006.01)
*G11C 16/34* (2006.01)

(52) U.S. Cl.
CPC ............ *G11C 16/28* (2013.01); *G11C 16/32* (2013.01); *G11C 16/3495* (2013.01); *G06F 2212/7205* (2013.01); *G11C 2207/102* (2013.01)

(56) References Cited

U.S. PATENT DOCUMENTS

| | | | | |
|---|---|---|---|---|
| 2009/0259803 | A1* | 10/2009 | Oh | G11C 11/5628 |
| | | | | 711/103 |
| 2013/0290615 | A1* | 10/2013 | Shah | G06F 3/0608 |
| | | | | 711/103 |
| 2014/0301429 | A1* | 10/2014 | Tsai | H04B 1/707 |
| | | | | 375/140 |
| 2015/0067436 | A1* | 3/2015 | Hu | G06F 11/1008 |
| | | | | 714/758 |

OTHER PUBLICATIONS

"Office Action of China Counterpart Application", dated Feb. 24, 2018, p. 1-p. 7.

* cited by examiner

DATA WRITING METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 103136997, filed on Oct. 27, 2014. The entirety of the above-mentioned patent application is hereby incorporated by reference herein and made a part of this specification.

BACKGROUND

1. Technology Field

The present invention is directed to a data writing method for a rewritable non-volatile memory module, a memory storage apparatus and a memory control circuit unit using the method.

2. Description of Related Art

Along with the widespread of digital cameras, cell phones, and MP3 players in recently years, the consumers' demand to storage media has increased drastically. Because a rewritable non-volatile memory is capable of providing features such as data non-volatility, low power consumption, small volume, and non-mechanical structure, high reading and writing speed, the rewritable non-volatile memory has become the most adaptable memory applied in a portable electronic product, e.g., a notebook computer. A solid state drive (SSD) is a storage apparatus which utilizes a flash memory as its storage medium. Therefore, the flash memory industry has become a very popular part of the electronic industry in recent years.

In order to increase space usage efficiency for storage apparatuses, manufactures start to add data compression mechanisms to storage apparatuses. Specifically, a control circuit of a storage apparatus usually performs a compression operation on data to be stored and then writes the compressed data with a smaller data length than the original data into the rewritable non-volatile memory module. Since the data length of the compressed data is unpredictable, and different data uses different compression rates, how to effectively write data with different data lengths under the condition that the space of each physical storage unit is fixed is a goal for technicians of this field to make effort to.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the present invention is directed to a data writing method, a memory storage apparatus and a memory control circuit unit capable of generating compressed data in a fixed integer multiple of a data length, so as to increase data writing efficiency and convenience of data management for the memory storage apparatus.

According to an exemplary embodiment, a data writing method for a rewritable non-volatile memory module is provided. The rewritable non-volatile memory module includes a plurality of physical erasing units, and each of the physical erasing units includes a plurality of physical programming units. The data writing method includes: compressing data to generate first data; and determining whether a data length of the first data meets a predetermined condition. The data writing method also includes: if the data length of the first data meets the predetermined condition, writing the first data into a first physical erasing unit among the physical erasing units; and if the data length of the first data does not meet the predetermined condition, generating dummy data according to a predetermined rule, padding the first data with the dummy data to generate second data and writing the second data into the first physical erasing unit, wherein a data length of the second data meets the predetermined condition.

According to an exemplary embodiment, a memory control circuit unit for controlling a memory control circuit unit of a rewritable non-volatile memory module is provided. The memory control circuit unit includes a host interface, a memory interface, a memory management circuit and a data compression/decompression circuit. The host interface is coupled to the host system. The memory interface is coupled to the rewritable non-volatile memory module. The rewritable non-volatile memory module includes a plurality of physical erasing units, and each of the physical erasing units includes a plurality of physical programming units. The memory management circuit is coupled to the host interface and the memory interface. The data compression/decompression circuit is coupled to the memory management circuit. The memory management circuit is configured to instruct the data compression/decompression circuit to compress data to generate first data, and determine whether a data length of the first data meets a predetermined condition. If the data length of the first data meets the predetermined condition, the memory management circuit is further configured to transmit a command sequence to the rewritable non-volatile memory module to instruct to write the first data into a first physical erasing unit among the physical erasing units. If the data length of the first data does not meet the predetermined condition, the memory management circuit is further configured to generate dummy data according to a predetermined rule, pad the first data with the dummy data to generate second data and transmit the command sequence to rewritable non-volatile memory module to instruct to write the second data to the first physical erasing unit among the physical erasing units, wherein a data length of the second data meets the predetermined condition.

According to an exemplary embodiment, a memory storage apparatus including a connection interface unit, a rewritable non-volatile memory module and a memory control circuit unit is provided. The connection interface unit is configured to be coupled to a host system. The rewritable non-volatile memory module has a plurality of physical erasing units, and each of the physical erasing units includes a plurality of physical programming units. The memory control circuit unit is coupled to the connection interface unit and the rewritable non-volatile memory module. The memory control circuit unit compresses data to generate first data and determines whether a data length of the first data meets a predetermined condition. If the data length of the first data meets the predetermined condition, the memory control circuit unit is further configured to transmit a command sequence to the rewritable non-volatile memory module to instruct to write the first data into a first physical erasing unit among the physical erasing units. If the data length of the first data does not meet the predetermined condition, the memory control circuit unit is further configured to generate dummy data according to a predetermined rule, pad the first data with the dummy data to generate second data and transmit the command sequence to the rewritable non-volatile memory module to instruct to write the second data into a first physical erasing unit among the physical erasing units. A data length of the second data meets the predetermined condition.

To sum up, in the data writing method, the memory control circuit unit and the memory storage apparatus of the exemplary embodiments, compressed data in an integer multiple of a predetermined length can be generated, so as to increase data writing efficiency and convenience of data management of the memory storage apparatus. Meanwhile, based on the data writing method of the exemplary embodiments, the memory storage apparatus can further dynamically change the data bits of the dummy data which is added to the compressed data each time when the compressed data is generated. Therefore, when each compressed data is stored, the units to which the memory storage apparatus writes data do not store the same dummy data, such that the memory storage apparatus can achieve an effect of averaging the loss to enhance the endurance of the memory storage apparatus and prolong the life span of the memory storage apparatus. It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
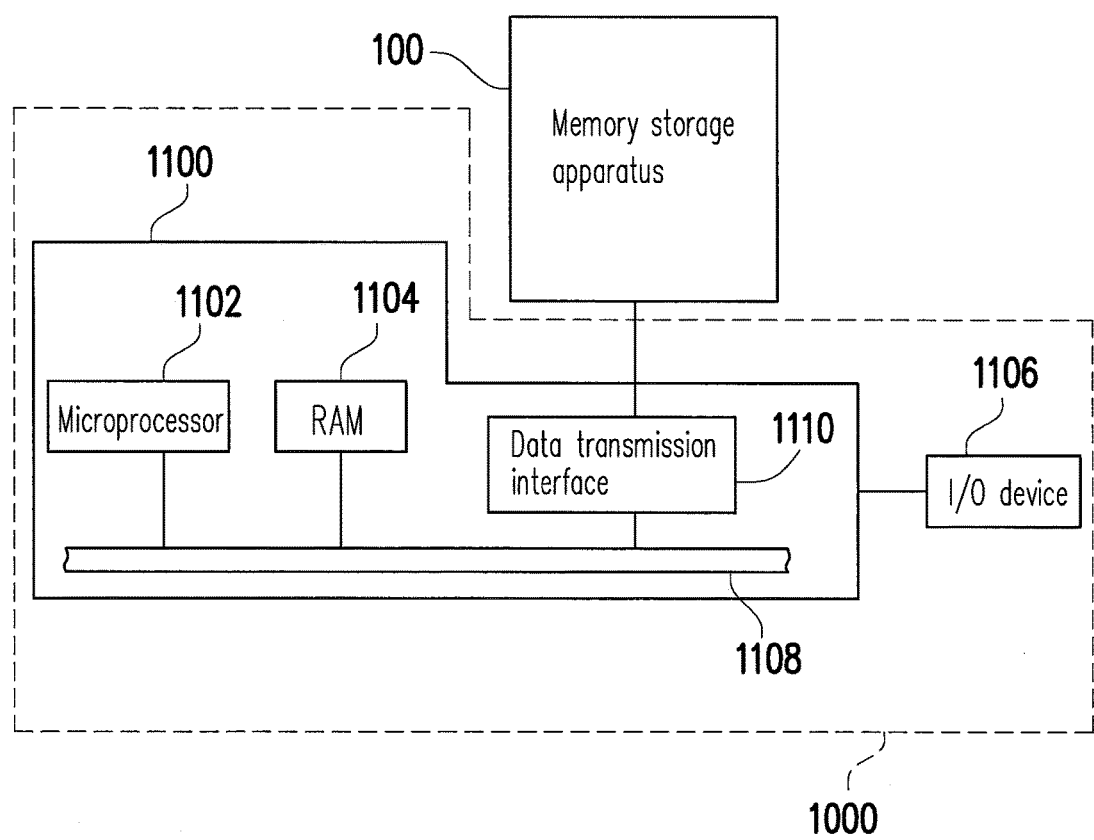
FIG. 1A is a schematic diagram illustrating a host system and a memory storage apparatus according to a first exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage apparatus (also referred to as a memory storage system) includes a rewritable non-volatile memory module and a controller (also called a control circuit). The memory storage apparatus is usually used together with a host system so that the host system can write data into or read data from the memory storage apparatus.

FIG. 1A is a schematic diagram illustrating a host system and a memory storage apparatus according to a first exemplary embodiment.

Figure 1B:
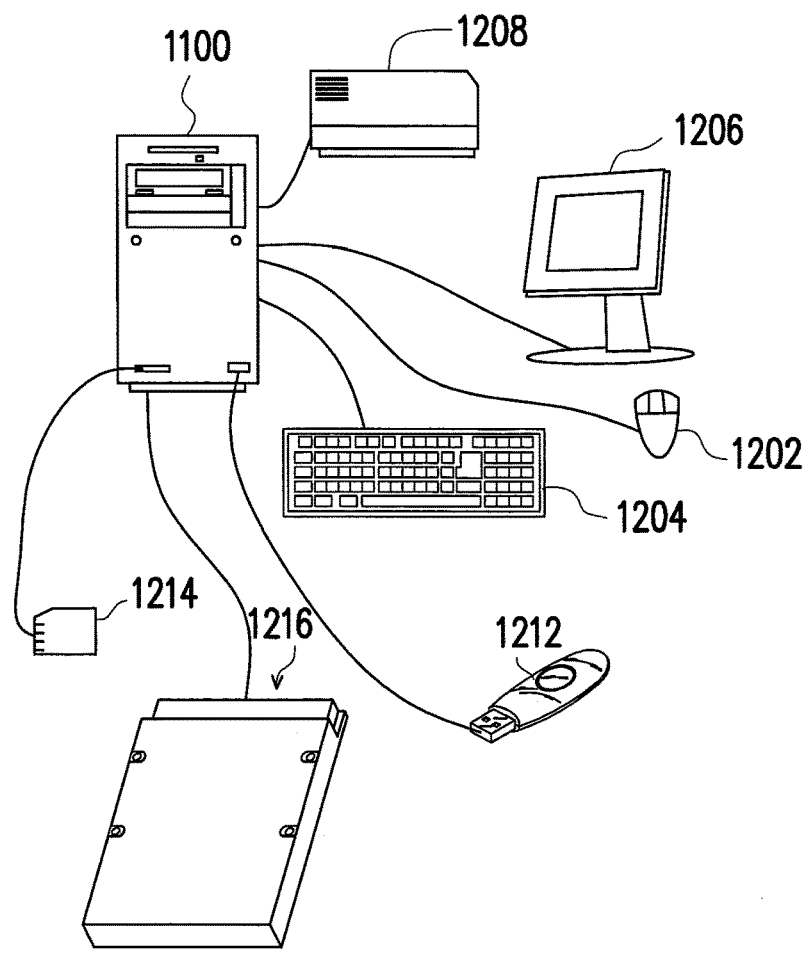
FIG. 1B is a schematic diagram illustrating a computer, an input/output (I/O) apparatus, and a memory storage apparatus according to the first exemplary embodiment.

Referring to FIG. 1A, a host system 1000 generally includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208 as shown in FIG. 1B. It should be noted that the devices illustrated in FIG. 1B do not limit the I/O device 1106, and the I/O device 1106 may further include other devices.

In the present exemplary embodiment, a memory storage apparatus 100 is coupled to other components of the host system 1000 through the data transmission interface 1110. With the operations of the microprocessor 1102, the RAM 1104, and the I/O device 1106, data can be written into or read from the memory storage apparatus 100. For instance, the memory storage apparatus 100 may be a rewritable non-volatile memory storage apparatus, such as a flash drive 1212, a memory card 1214, or a solid state drive (SSD) 1216 illustrated in FIG. 1B.

Figure 1C:
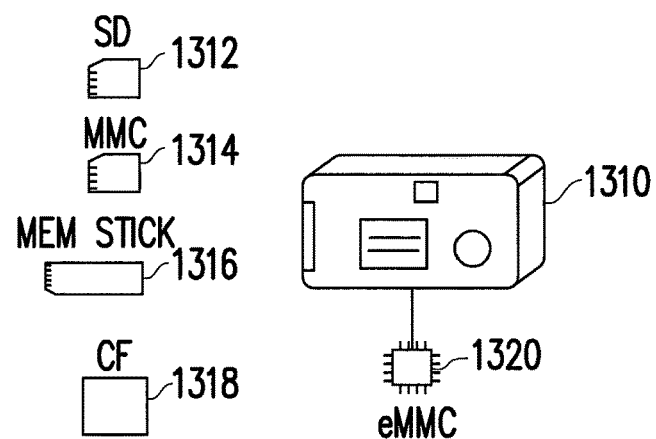
FIG. 1C is a schematic diagram illustrating a host system and a memory storage apparatus according to the first exemplary embodiment.

Generally speaking, the host system 1000 can be substantially any system that works with the memory storage device 100 to store data. Even though the host system 1000 is described as a computer system in the present exemplary embodiment, in another exemplary embodiment of the invention, the host system 1000 may also be a digital camera, a video camera, a communication apparatus, an audio player, or a video player. For example, if the host system is a digital camera (video camera) 1310 depicted in FIG. 1C, the rewritable non-volatile memory storage apparatus is then a secure digital (SD) card 1312, a multi media card (MMC) card 1314, a memory stick (MS) 1316, a compact flash (CF) card 1318, or an embedded storage device 1320 (as shown in FIG. 1C) used by the digital camera (video camera) 1310. The embedded storage device 1320 includes an embedded MMC (eMMC). It should be mentioned that an eMMC is directly coupled to the motherboard of a host system.

Figure 2:
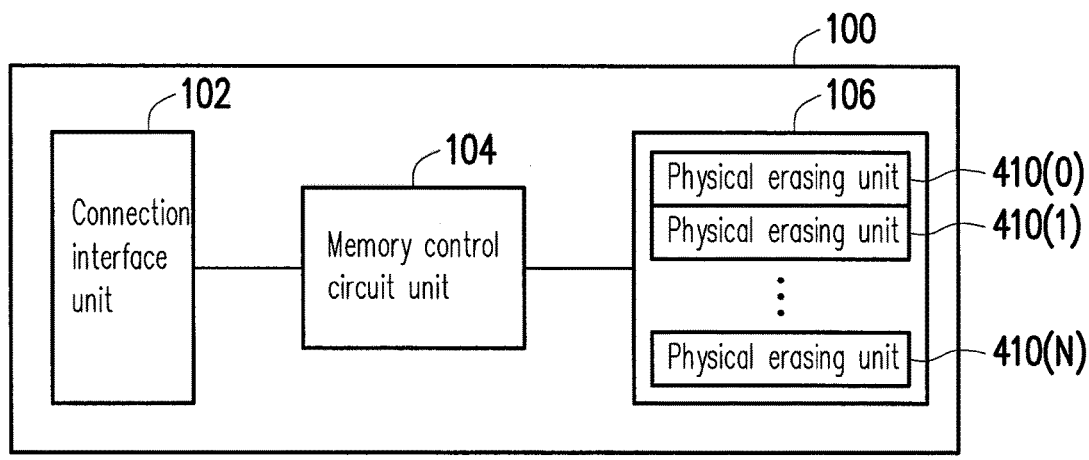
FIG. 2 is a schematic block diagram illustrating a memory storage apparatus according to the first exemplary embodiment.

FIG. 2 is a schematic block diagram illustrating a memory storage apparatus according to the first exemplary embodiment of the invention.

Referring to FIG. 2, the memory storage apparatus 100 includes a connection interface unit 102, a memory control circuit unit 104 and a rewritable non-volatile memory module 106.

In the present exemplary embodiment, the connection interface unit 102 complies with the serial advanced technology attachment (SATA) standard. However, the invention is not limited thereto, and the connection interface unit 102 may also comply with the parallel advanced technology attachment (PATA) standard, the Institute of Electrical and Electronic Engineers (IEEE) 1394 standard, the peripheral component interconnect express (PCI Express) standard, the universal serial bus (USB) standard, the ultra high speed-I (UHS-I) interface standard, the ultra high speed-II (UHS-II) interface standard, the secure digital (SD) interface standard, the memory stick (MS) interface standard, the multi media card (MMC) interface standard, the compact flash (CF) interface standard, the integrated device electronics (IDE) standard, or any other suitable standard. In the present exemplary embodiment, the connection interface unit and the memory control circuit unit may be packaged into one chip, or the connection interface unit is laid outside of a chip containing the memory control circuit unit.

The memory controlling circuit unit 104 is configured to execute a plurality of logic gates or control instructions which are implemented in a hardware form or in a firmware form and perform operations of writing, reading or erasing data in the rewritable non-volatile memory storage module 106 according to the commands of the host 1000.

The rewritable non-volatile memory storage module 106 is coupled to the memory control circuit unit 104 and configured to store data written from the host system 1000. The rewritable non-volatile memory module 106 has physical erasing unit 410(0) to 410(N). For example, the physical erasing unit 410(0) to 410(N) may belong to the same memory die or belong to different memory dies. Each physical erasing unit has a plurality of physical programming units, and the physical programming units of the same physical erasing unit may be written separately and erased simultaneously. Additionally, each physical erasing unit may be composed by 64 physical programming units, 256 physical programming units or any number of the physical programming units In more detail, a physical erasing unit is the smallest unit for erasing. Namely, each of the physical erasing units has the least number of memory cells for being erased altogether. A physical programming unit is the smallest unit for programming. Namely, each of the physical programming units is the smallest unit for writing data. Each physical programming unit commonly includes a data but area and a redundant bit area. The data bit area includes a plurality of physical access addresses for storing user data, and the redundant bit area is used for storing system data (e.g., control information and an error checking and correcting (ECC) code). Herein, the capacity of a physical programming unit is defined as including the capacity of the data bit area and the capacity of the redundant bit area. For example, in the present exemplary embodiment, the capacity of the data bit area of each physical programming units for storing the user data is 2 kilobytes (KB), and the capacity of the redundant bit area is 64 bytes (B). Namely, the data bit area of each physical programming unit contains 4 physical access addresses, and a size of each physical access address is 512 bytes. However, it should be understood that the invention is not limited thereto. For example, in other exemplary embodiments, each data bit area may also contain more or less physical access addresses, and the invention is not intent to limit the size and the number of each physical access address. For example, in an exemplary embodiment, the physical erasing units may be physical blocks, and the physical programming units may be physical pages or physical sectors, but the invention is not limited thereto.

In the present exemplary embodiment, the rewritable non-volatile memory module 106 is a multi level cell (MLC) NAND flash memory module (i.e., each memory cell can store data of two bits). However, the invention is not limited thereto. The rewritable non-volatile memory module 106 may also be a single level cell (SLC) NAND flash memory module (i.e., each memory cell can store data of one bit), a trinary level cell (TLC) NAND flash memory module (i.e., each memory cell can store data of three bits) or any other flash memory module having the same characteristics.

Figure 3:
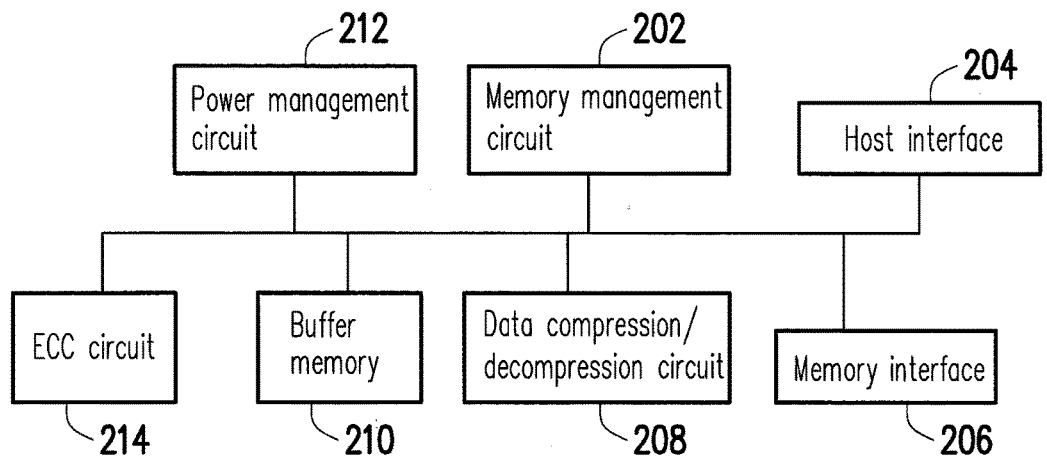
FIG. 3 is a schematic block diagram illustrating a memory control circuit unit according to the first exemplary embodiment.

FIG. 3 is a schematic block diagram illustrating a memory control circuit unit according to the first exemplary embodiment of the invention.

Referring to FIG. 3, the memory control circuit unit 104 includes a memory management circuit 202, a host interface 204, a memory interface 206, and a data compression/decompression circuit 208.

The memory management circuit 202 is configured to control the overall operation of the memory control circuit unit 104. Specifically, the memory management circuit 202 has a plurality of control instructions, and when the memory storage apparatus 100 is in operation, the control instructions are executed to issue a command sequence to the rewritable non-volatile memory module 106, so as to perform operations, such as writing data into, reading data from or erasing data from the rewritable non-volatile memory module 106.

In the present exemplary embodiment, the control instructions of the memory management circuit 202 are implemented in a firmware form. For example, the memory management circuit 202 has a microprocessor unit (not shown) and a read-only memory (ROM, not shown), and the control instructions are burnt into the ROM. When the memory storage apparatus 100 is in operation, the control instructions are executed by the microprocessor unit to perform operations, such as data writing, reading or erasing.

In another exemplary embodiment of the invention, the control instructions of the memory management circuit 202 may also be stored in a specific area of the rewritable non-volatile memory module 106 (for example, a system area exclusively used for storing system data in a memory module) as program codes. In addition, the memory management circuit 202 has a microprocessor unit (not shown), a ROM (not shown), and a RAM (not shown). In particular, the ROM has a boot code, and when the memory control circuit unit 104 is enabled, the microprocessor unit first executes the boot code to load the control instructions from the rewritable non-volatile memory module 106 into the RAM of the memory management circuit 202. Thereafter, the microprocessor unit runs the control instructions to perform data writing, reading, and erasing operations.

Additionally, in another exemplary embodiment of the invention, the control instructions of the memory management circuit 202 may also be implemented in a hardware form. For example, the memory management circuit 202 includes a microcontroller, a memory cell management unit, a memory writing circuit, a memory reading circuit, a memory erasing circuit, and a data processing circuit. The memory cell management unit, the memory writing circuit, the memory reading circuit, the memory erasing circuit, and the data processing circuit are coupled to the microcontroller. The memory cell management circuit is configured to manage the physical erasing units of the rewritable non-volatile memory module 106. The memory writing circuit is configured to issue a write command to the rewritable non-volatile memory module 106 to write data into the rewritable non-volatile memory module 106. The memory reading circuit is configured to issue a read command to the rewritable non-volatile memory module 106 to read data from the rewritable non-volatile memory module 106. The memory erasing circuit is configured to issues an erase command to the rewritable non-volatile memory module 106 to erase data from the rewritable non-volatile memory module 106. The data processing circuit is configured to process data to be written into the rewritable non-volatile memory module 106 or data read from rewritable non-volatile memory module 106.

The host interface 204 is coupled to the memory management circuit 202 and configured to receive and identify commands and data transmitted from the host system 1000. That is, the commands and data transmitted by the host system 1000 are sent to the memory management circuit 202 through the host interface 204. In the present exemplary embodiment, the host interface 204 complies with the SATA standard. However, the invention is not limited thereto, and the host interface 204 may also comply with the PATA standard, the IEEE 1394 standard, the PCI express standard, the USB standard, the UHS-I standard, the UHS-II standard, the SD standard, the MS standard, the MMC standard, the CF standard, the IDE standard, or any other suitable data transmission standard.

The memory interface 206 is coupled to the memory management circuit 202 and configured to access the rewritable non-volatile memory module 106. Namely, data to be written into the rewritable non-volatile memory module 106 is converted by the memory interface 206 into a format acceptable to the rewritable non-volatile memory module 106.

The data compression/decompression circuit 208 is coupled to the memory management circuit 202. In the present exemplary embodiment, the data compression/decompression circuit 208 is configured to compress data to be written into the rewritable non-volatile memory module 106 and decompress data read from the rewritable non-volatile memory module 106. For example, the data compression/decompression circuit 208 includes a compressor and a decompressor. The compressor is configured to identify data redundancy in original data, remove the identified redundancy and encode the remaining essential data to output an encoded result (i.e., compressed data). The decompressor is configured to decode read compressed data according to default steps and output a decoded result (i.e., decompressed data). In the present exemplary embodiment, the data compression/decompression circuit 208 compresses the data by using by using a lossless compression algorithm in order to make sure that the compressed data can be restored.

In an exemplary embodiment of the invention, the memory control circuit unit 104 may also include a buffer memory 210, a power management circuit 212 and an error checking and correcting (ECC) circuit 214.

The buffer memory 210 is coupled to the memory management circuit 202 and configured to temporarily store data and commands from the host system 1000 or data from the rewritable non-volatile memory module 106.

The power management circuit 212 is coupled to the memory management circuit 202 and configured to control the power supply of the memory storage apparatus 100.

The ECC circuit 214 is coupled to the memory management circuit 202 and configured to perform an ECC procedure to ensure data accuracy. To be specific, when the memory management circuit 202 receives a write command from the host system 1000, the ECC circuit 216 generates a corresponding ECC code for the data corresponding to the write command, and the memory management circuit 202 writes the data and the ECC code corresponding to the write command into the rewritable non-volatile memory module 106. Subsequently, when reading the data from the rewritable non-volatile memory module 106, the memory management circuit 202 also reads the ECC code corresponding to the data, and the ECC circuit 216 performs the ECC procedure on the read data according to the ECC code.

It should be mentioned that the number of error bits that can be corrected by the ECC circuit 214 is proportional to the size of the ECC code. Namely, the more error bits the ECC circuit 210 is designed to correct, the more storage space is needed for storing the generated ECC code. However, the capacity of the redundancy bit area for storing the ECC code is fixed (which varies with the type of the rewritable non-volatile memory module), the ECC algorithm adopted by the ECC circuit 214 is limited by the type of the rewritable non-volatile memory module 106. In particular, the ECC circuit 214 may be configured as capable of correcting a number of error bits (which is referred to as a maximum number of correctable error bits hereinafter). For example, the maximum number of correctable error bits may be 48. If a number of the error bits occurring in the read data is not more than 48, the ECC circuit 214 may correct the error bits back to accurate values according to the ECC code. Otherwise, the ECC circuit 214 may report a failure of error correcting, and the memory management circuit 202 may transmit a message indicating that the data is lost to the host system 1000.

Figure 4A:
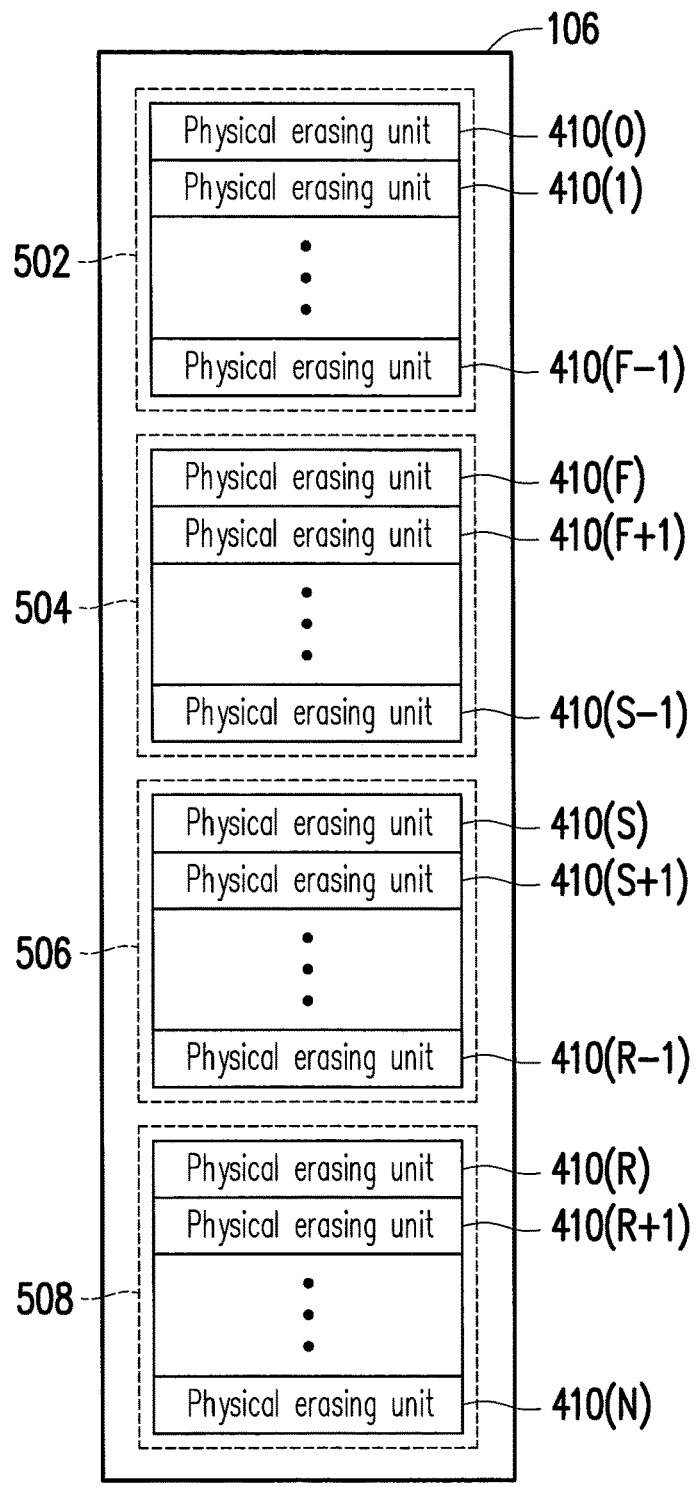
FIG. 4A and FIG. 4B are example schematic diagrams of managing physical erasing units according to the first exemplary embodiment.
Figure 4B:
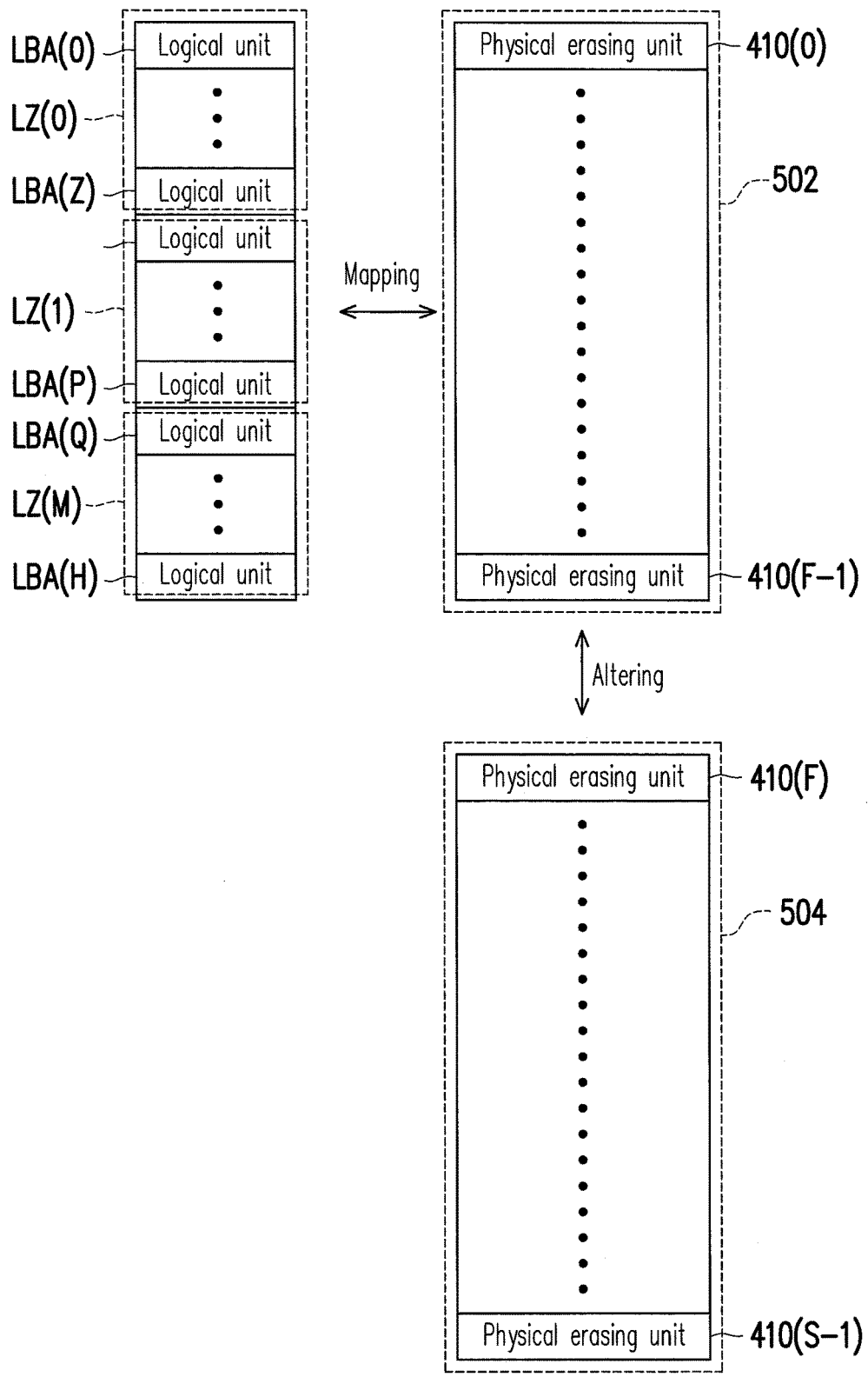

FIG. 4A and FIG. 4B are example schematic diagrams of managing physical erasing units according to the first exemplary embodiment.

It should be understood that when describing the operations of the physical erasing units of the rewritable non-volatile memory module 106, the usage of terms, such as "select", "replace", "group" and "alternate" are logical concepts for the operations of the physical erasing units. In other words, the actual locations of the physical erasing units of the rewritable non-volatile memory module do not change, but the physical erasing units of the rewritable non-volatile memory module are operated logically.

Referring to FIG. 4A, the memory control circuit unit 104 (or the memory management circuit 202) logically groups the physical erasing unit 410(0) to 410(N) into a data area 502, a spare area 504, a system area 506 and a replacement area 508.

The physical erasing units logically belonging to the data area 502 and the spare area 504 are used to store data from the host system 1000. Specifically, the physical erasing units belonging to the data area 502 are considered as the physical erasing units of stored data, and the physical erasing units belonging to spare area 504 are used to replace the physical erasing units in the data area 502. Thus, when the host system 1000 receives a write command and data to be written, the memory control circuit unit 104 (or the memory management circuit 202) selects a physical erasing unit from the spare area 504, and writes the data into the selected physical erasing unit in replacement with the physical erasing unit in the data area 502.

The physical erasing units logically belonging to system area 506 are used to record system data, which includes the manufacturer and model of the rewritable non-volatile memory module, the number of the physical erasing units of the rewritable non-volatile memory module, and the number of the physical programming units of each physical erasing unit.

The physical erasing units logically belonging to replacement area 508 are used in a bad physical erasing unit replacement procedure to replace damaged physical erasing units. Specifically, if there are still normal physical erasing units in the replacement area 508, and a physical erasing unit in the data area 502 is damaged, the memory control circuit unit 104 (or the memory management circuit 202) selects a normal physical erasing unit from the replacement area 508 to replace the damaged physical erasing unit.

Particularly, the numbers of the physical erasing units in the data area 502, the spare area 504, the system area 506 and the replacement area 508 vary with different memory specifications. Furthermore, it should be understood that in the operation of the memory storage apparatus 100, the grouping relationship of the physical erasing units associated to the data area 502, the spare area 504, the system area 506 and the replacement area 508 may change dynamically. For example, when a physical erasing unit in the spare area 504 is damaged and replaced by a physical erasing unit from the replacement area 508, the physical erasing unit originally belonging to the replacement area 508 is associated to the spare area 504.

Referring to FIG. 4B, the memory control circuit unit 104 (or the memory management circuit 202) may configure logical addresses LBA(0) to LBA(H) for mapping the physical erasing units of the data area 502, in which each logical address has a plurality of logical sub-units for orderly mapping to the physical programming units of the corresponding physical erasing units. Also, when the host system is to write data into a logical address or update the data stored in a logical address, the memory control circuit unit 104 (or the memory management circuit 202) may select a physical erasing unit from the spare area 504 to write the data for altering the physical erasing units belonging to the data area 502. In the present exemplary embodiment, each logical sub-unit may be a logical page or a logical sector.

In order to identify that in which physical erasing unit the data of each logical address is stored, in the present exemplary embodiment, the memory control circuit unit 104 (or the memory management circuit 202) may record the mapping relation between logical addresses and physical erasing units. Also, when the host system 1000 is about to access data from a logical sub-unit, the memory control circuit unit 104 (or the memory management circuit 202) may identify which logical address this logical sub-unit belongs to and access data from the physical erasing unit mapped to this logical address. For example, in the present exemplary embodiment, the memory control circuit unit 104 (or the memory management circuit 202) may store a logical address-physical address mapping table in the rewritable non-volatile memory module 106 to record the physical erasing units mapped to each logical address, and when being about to access data, the memory control circuit unit 104 (or the memory management circuit 202) may load the logical address-physical address mapping table into the buffer memory 210 for maintaining.

It should be mentioned that, because the limited capacity of the buffer memory 210 cannot record the mapping tables of mapping relation of all logical addresses, in the present exemplary embodiment, the memory control circuit unit 104 (or the memory management circuit 202) may group the logical addresses LBA(0) to LBA(H) into a plurality of logical areas LZ(0) to LZ(M), and may configure a logical address-physical address mapping table for each logical area. Particularly, when the memory control circuit unit 104 (or memory management circuit 202) is about to update a mapping of a certain logical address, the logical address-physical address mapping table corresponding to the logical area which this logical addresses belongs to may be loaded into the buffer memory 210 for updating.

Figure 5:
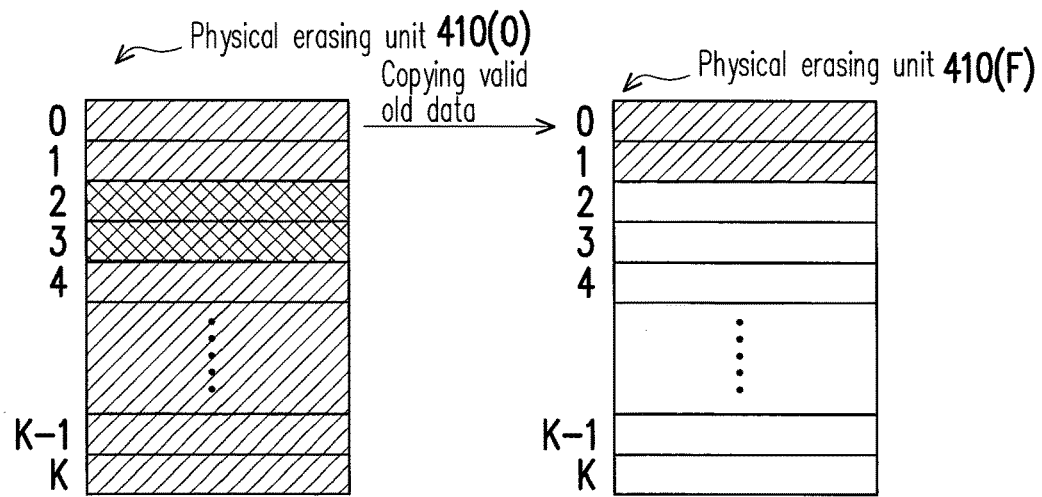
FIG. 5 to FIG. 7 are example schematic diagrams of writing data into the rewritable non-volatile memory module according to the first exemplary embodiment.
Figure 6:
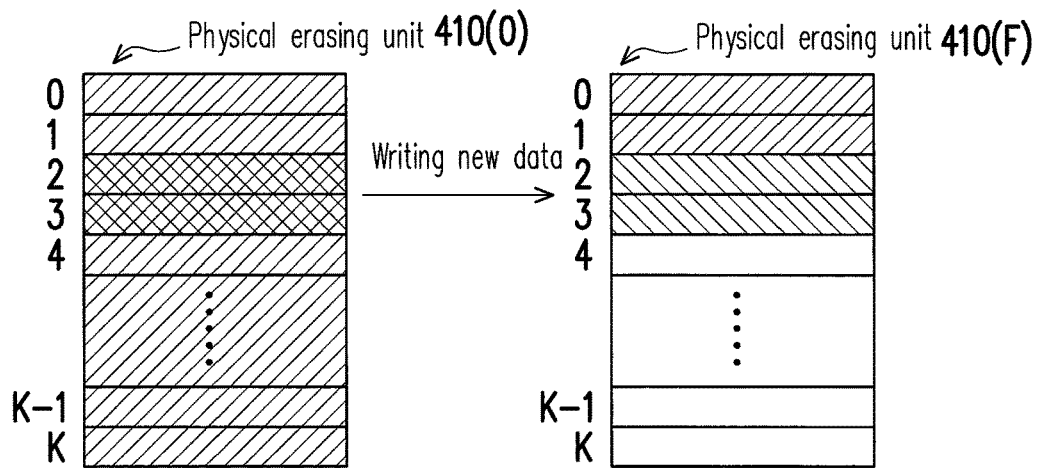
Figure 7:
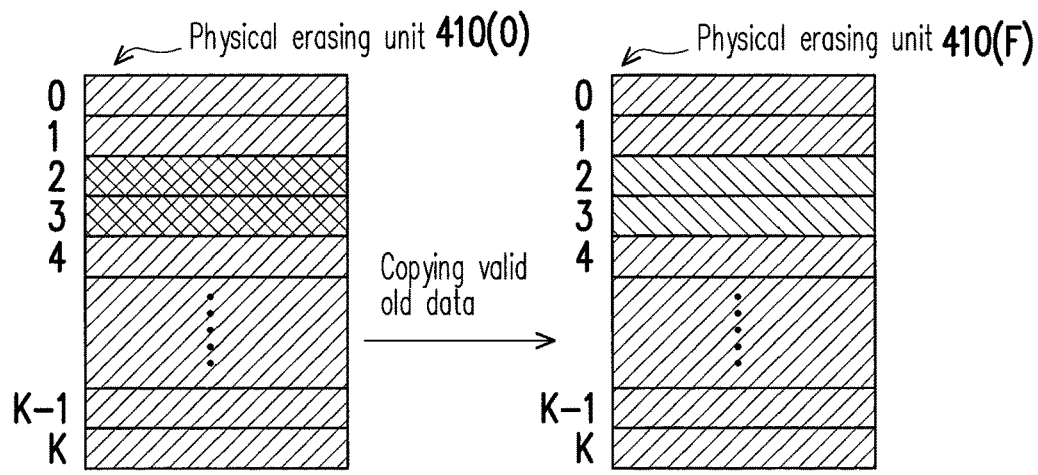

FIG. 5 to FIG. 7 are example schematic diagrams of writing data into the rewritable non-volatile memory module according to the first exemplary embodiment.

Referring to FIG. 5 to FIG. 7, in the present exemplary embodiment, the management of the rewritable non-volatile memory module 106 of the memory storage apparatus 100 is performed based on the physical erasing units (which is also referred to as block-based management). Specifically, in a case where the logical address LBA(0) is mapped to the physical erasing unit 410(0), when the memory control circuit unit 104 (or the memory management circuit 202) receives a write command from the host system 1000 and accordingly is about to write data into a logical access address belonging to the logical address LBA(0), the memory control circuit unit 104 (or the memory management circuit 202) may identify that the logical address LBA(0) is currently mapped to the physical erasing unit 410(0) according to the logical address-physical address mapping table and select the physical erasing unit 410(F) from the spare area 504 as a substitution physical erasing unit to alternate with the physical erasing unit 410(0). However, while writing new data into the physical erasing unit 410(F), the memory control circuit unit 104 (or the memory management circuit 202) does not instantly move all the valid data from the physical erasing unit 410(0) to the physical erasing unit 410(F) to erase the physical erasing unit 410(0). To be specific, the memory control circuit unit 104 (or the memory management circuit 202) may copy the valid data before the physical programming units for writing the data in the physical erasing unit 410(0) (i.e., data in the $0^{th}$ and the $1^{st}$ physical programming units of the physical erasing unit 410(0)) to the $0^{th}$ and the $1^{st}$ physical programming units of the physical erasing unit 410(F) (as shown in FIG. 5), and write the new data to the $2^{nd}$ and the $3^{rd}$ physical programming units of the physical erasing unit 410(F) (as shown in FIG. 6). Herein, the memory control circuit unit 104 (or the memory management circuit 202) completes the data writing operation. Because the valid data in the physical erasing unit 410(0) may become invalid in a next operation (for example, a write command), instantly moving all the valid data from the physical erasing unit 410(0) to the physical erasing unit 410(F) may become meaningless. In addition, since data has to be sequentially written into the physical programming units of a physical erasing unit, the memory control circuit unit 104 (or the memory management circuit 202) may only move the valid data before the physical programming unit for writing the data.

In the present exemplary embodiment, the operation for maintaining such a temporary mother-child relationship (i.e., the relationship between the physical erasing unit 410(0) and the physical erasing unit 410(F)) is referred to as opening mother-child units, in which the original physical erasing unit is referred to as a mother physical erasing unit, while the substitution physical erasing unit is referred to as a child physical erasing units.

Subsequently, when the data in the physical erasing unit 410(0) and the physical erasing unit 410(F) is to be merged, the memory control circuit unit 104 (or the memory management circuit 202) combines the data in the physical erasing unit 410(0) and the physical erasing unit 410(F) together into a single physical erasing unit, such that the efficiency in using the physical erasing units can be improved. In this case, Herein the operation for merging the mother-child units is referred to as a data merging procedure or closing mother-child blocks. For example, as shown in FIG. 7, while closing the mother-child units, the memory control circuit unit 104 (or the memory management circuit 202) may copy the remaining valid data in the physical erasing unit 410(0) (i.e., data in the $4^{th}$ to the $(K)^{th}$ physical programming units in the physical erasing unit 410(0)) to the $4^{th}$ to the $(K)^{th}$ physical programming units in the substitution physical erasing unit 410(F). Then, the memory control circuit unit 104 (or the memory management circuit 202) may erase the physical erasing unit 410(0), associate the physical erasing unit 410(0) to the spare area 504, and simultaneously associate the physical erasing unit 410(F) to the data area 502. In other words, the memory control circuit unit 104 (or the memory management circuit 202) may re-map the logical address LBA(0) to the physical erasing unit 410(F) in the logical address-physical address mapping table. Additionally, in the present exemplary embodiment, the memory control circuit unit 104 (or the memory management circuit 202) may establish a spare area physical erasing unit table (not shown) to record the physical erasing units that are currently associated to the spare area. It should be mentioned that the number of the physical erasing units is limited in the spare area 504. Accordingly, during the operation of the memory storage apparatus 100, the number of the mother-child unit sets being opened is also limited. Thus, when the memory storage apparatus 100 receives a write command from the host system 1000, if the number of opened mother-child units has reached its upper limit, the memory control circuit unit 104 (or the memory management circuit 202) needs to close at least one set of mother-child blocks (i.e., perform the operation of closing mother-child units) before it executes the write command. Herein, the writing operation illustrated in FIG. 5 to FIG. 7 is referred to as a normal write mode.

It should be noted that in another exemplary embodiment, the management of the rewritable non-volatile memory module 106 of the memory storage apparatus 100 may also be performed based on the physical programming units (which is also referred to as page-based management), which is not limited in the present invention. For example, in the execution of the write command, no matter which logical sub-unit of a logical unit the data is currently about to be written into, the memory control circuit unit 104 (or the memory management circuit 202) may write data in a manner of one physical programming unit following another physical programming unit (which is referred to as a random writing mechanism hereinafter). Specifically, the memory control circuit unit 104 (or the memory management circuit 202) may select an empty physical erasing unit from the spare area 504 to serve it as a currently active physical erasing unit to write data. Meanwhile, when the currently active physical erasing unit is full, the memory control circuit unit 104 (or the memory management circuit 202) may further select another empty physical erasing unit from the spare area 504 to serve it as the currently active physical erasing unit to continuously write the data corresponding to the write command from the host system 1000.

In the present exemplary embodiment, when being about to write data, the memory control circuit unit 104 (or the memory management circuit 202) may instruct the data compression/decompression circuit 208 to compress the data to generate compressed data (which is referred to as first data hereinafter). It should be noted that in another exemplary embodiment, the memory control circuit unit 104 (or the memory management circuit 202) may first determines whether the data to be written is compressible, and determine whether to instruct the data compression/decompression circuit 208 to compress the data to generate the first data according to the determination result. For example, after determining that the data to be written is compressible, the memory control circuit unit 104 (or the memory management circuit 202) further instructs the data compression/decompression circuit 208 to perform the compression operation on the data.

Particularly, the memory control circuit unit 104 (or the memory management circuit 202) may determine whether a data length of the first data generated through the compression operation meets a predetermined condition. If the data length of the first data meets the predetermined condition, the memory control circuit unit 104 (or the memory management circuit 202) selects a currently used physical programming unit (which is referred to as a first physical programming unit) and writes the first data into the first physical programming unit. If the data length of the first data does not meet the predetermined condition, the memory control circuit unit 104 (or the memory management circuit 202) generates dummy data, pads the first data with the dummy data, such that the padded data (referred to as second data hereinafter) meets the predetermined condition. The memory control circuit unit 104 (or the memory management circuit 202) may write the compressed data having the data length meeting the predetermined condition (i.e., the first data or the second data having the data length meeting the predetermined condition) into the first physical programming unit. Namely, in the data writing method of the exemplary embodiment, the data length of the compressed data written by the memory control circuit unit 104 (or the memory management circuit 202) certainly meets the predetermined condition.

Figure 8:
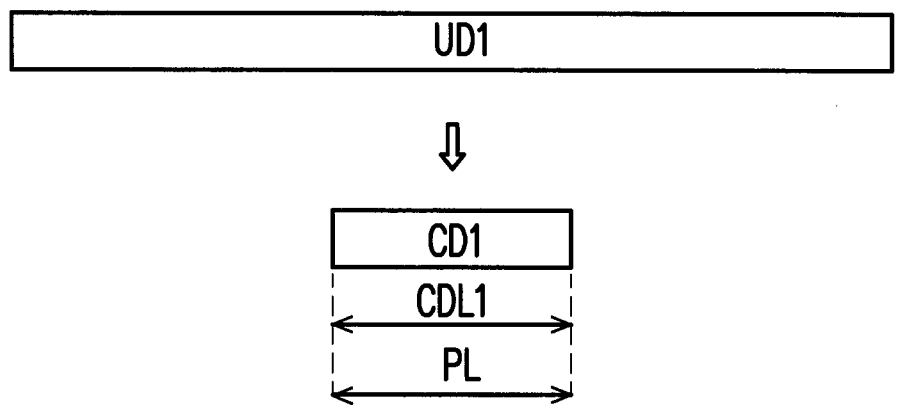
FIG. 8 is an example schematic diagram of processing data to be written into the rewritable non-volatile memory module according to an exemplary embodiment.

FIG. 8 is an example schematic diagram of processing data to be written into the rewritable non-volatile memory module according to an exemplary embodiment.

Referring to FIG. 8, in the present exemplary embodiment, when being about to write data UD1 having a data length of 4 kilobytes (KB), the memory control circuit unit 104 (or the memory management circuit 202) first instructs the data compression/decompression circuit 208 to compress the data UD1. For example, the data compression/decompression circuit 208 may compress the data UD1 into data CD1, in which a data length of the data CD1 is 1 KB.

In the present exemplary embodiment, the memory control circuit unit 104 (or the memory management circuit 202) determines whether a data length CDL1 of the data CD1 meets a predetermined condition.

For example, when a data length of the compressed data is an integer multiple of a predetermined length, the memory control circuit unit 104 (or the memory management circuit 202) may determine that the data length of the compressed data meets the predetermined condition. In the present exemplary embodiment, the predetermined length may be set according to a length of an error checking and correcting (ECC) code frame in a physical programming unit. For example, in the present exemplary embodiment, the predetermined length may be set as 1 KB (i.e., 1024 bytes), while in another exemplary embodiment, the predetermined length may be set as 2 KB, 3 KB, 4 KB or any other length according to manufacturers' requirements.

In the example illustrated in FIG. 8, the data length CDL1 of the data CD1 is 1 KB and equals to the predetermined length PL. Thus, the memory control circuit unit 104 (or the memory management circuit 202) determines that the data CD1 meets the predetermined condition. Then, the memory control circuit unit 104 (or the memory management circuit 202) selects an available physical programming unit (which is referred to as a first physical programming unit) and writes the data CD1 having the data length meeting the predetermined condition into the first physical programming unit.

Figure 9:
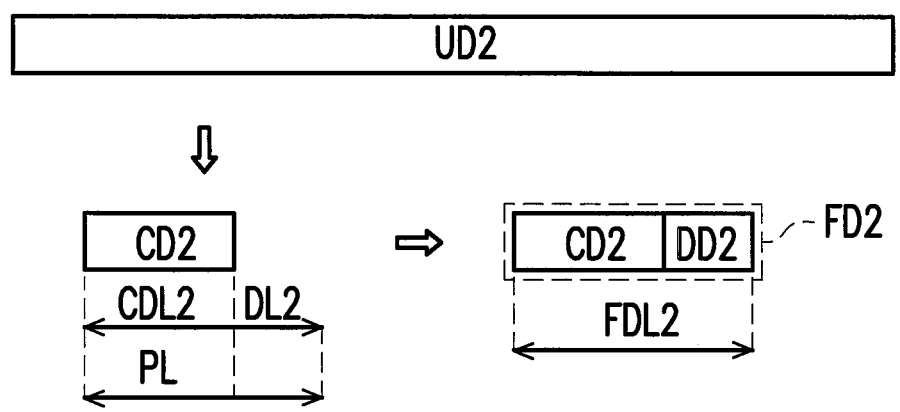
FIG. 9 is an example schematic diagram of processing data to be written into the rewritable non-volatile memory module according to another exemplary embodiment.

FIG. 9 is an example schematic diagram of processing data to be written into the rewritable non-volatile memory module according to another exemplary embodiment.

Referring to FIG. 9, for example, when being about to write data UD2 having a data length of 4 KB, the memory control circuit unit 104 (or the memory management circuit 202) first instructs the data compression/decompression circuit 208 to compress the data UD2. For example, the data compression/decompression circuit 208 may compress the data UD2 into data CD2, in which a data length CDL2 of the data CD2 is 800 B. Then, the memory control circuit unit 104 (or the memory management circuit 202) determines whether the data length CDL2 of the data CD2 meets the predetermined condition.

In the example illustrated in FIG. 9, the data length CDL2 of the data CD2 is 800 bytes and does not equal to an integer multiple of the predetermined length PL (i.e., the data length CDL2 of the data CD2 is less than the predetermined length PL), the memory control circuit unit 104 (or the memory management circuit 202) determines that the data CD2 does not meet the predetermined condition. Particularly, since the data length CDL2 of the data CD2 is less than the predetermined length PL, the memory control circuit unit 104 (or the memory management circuit 202) calculates a difference DL2 (i.e., 224 bytes) between the predetermined length PL and the data length CDL2 of the data CD2 and generates dummy data DD2 having a data length equaling to the difference DL2 between the predetermined length PL and the data length CDL2 of the data CD2. Then, the memory control circuit unit 104 (or the memory management circuit 202) pads the data CD2 with the dummy data DD2 to form data FD2. Thereby, a data length FDL2 of the data FD2 formed in this manner equals to the predetermined length PL. Accordingly, the data length FDL2 of the data FD2 is an integer multiple of the predetermined length PL and meets the predetermined condition. In other words, in the case where the data length of the data CD2 does not meet the predetermined condition, the memory control circuit unit 104 (or the memory management circuit 202) generates the data FD2 meeting the predetermined condition by means of padding the data CD2 with the dummy data DD2. It is to be mentioned that the dummy data DD2 may be added after or before the data CD2 to form the data FD2, which is not limited in the invention.

Figure 10:
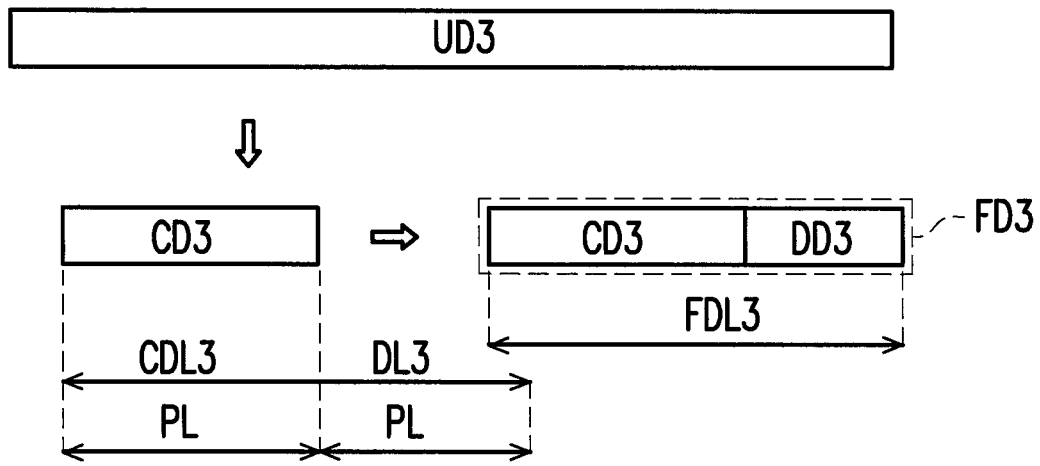
FIG. 10 is an example schematic diagram of processing data to be written into the rewritable non-volatile memory module according to yet another exemplary embodiment.

FIG. 10 is an example schematic diagram of processing data to be written into the rewritable non-volatile memory module according to yet another exemplary embodiment.

Referring to FIG. 10 which is similar to the example illustrated in FIG. 9, in the example illustrated in FIG. 10, data UD3 is compressed into data CD3, a data length CDL3 of the data CD3 is 1200 bytes. Since the data length CDL3 (i.e., 1200 B) of the data CD3 is greater than the predetermined length PL (i.e., 1024 bytes), but less than twice the predetermined length PL (i.e., 2048 bytes), and a difference DL3 between the data length of the first data CD3 and twice the predetermined length PL is 848 bytes (i.e., 2048−1200=848), the memory control circuit unit 104 (or the memory management circuit 202) generates dummy data DD3 having a data length of 848 bytes and pads the data CD3 with the dummy data DD3 to form data FD3. Thereby, the data length FDL3 of the data FD3 equals to twice the predetermined length PL and meets the predetermined condition.

It is to be mentioned that in the present exemplary embodiment, when the data length of the compressed data is an integer multiple of the predetermined length, the memory control circuit unit 104 (or the memory management circuit 202) determines that the data length of the compressed data meets the predetermined condition, but the present invention is not limited thereto. The condition required for the compressed data may not be limited to data length of the compressed data to be an integer multiple of the predetermined length. For example, in another exemplary embodiment, if the data length of the compressed data meets a sum of the predetermined length plus a constant value or a sum of an integer multiple of the predetermined length plus a constant value, the memory control circuit unit 104 (or the memory management circuit 202) may determines that the data length of the compressed data meets the predetermined condition.

In the exemplary embodiments, the dummy data may be generated according to a predetermined rule. Several exemplary embodiments are provided to describe a method of generating dummy data according to the predetermined rule of the invention with reference to the accompanying drawings.

Figure 11:
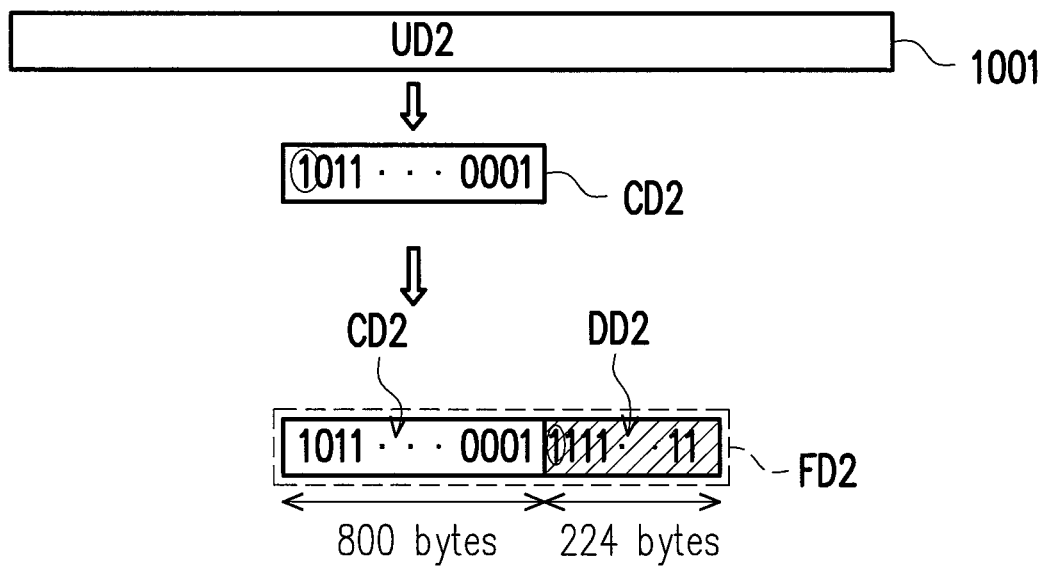
FIG. 11 is a flowchart illustrating a method of generating the dummy data in FIG. 9 according to an exemplary embodiment.

FIG. 11 is a flowchart illustrating a method of generating the dummy data in FIG. 9 according to an exemplary embodiment of the invention.

In the present exemplary embodiment, the predetermined rule refers to the memory control circuit unit 104 (or the memory management circuit 202) generating the dummy data according to data bits content of the compressed data. To be specific, referring to FIG. 11, when the data compression/decompression circuit 208 compresses the data UD2 into the data CD2, the memory control circuit unit 104 (or the memory management circuit 202) identifies the data bits content of the data CD2, which is "1011 . . . 0001" and retrieves data in the $1^{st}$ bit of the data CD2 (i.e., "1" circled in FIG. 11) as a base pattern and then generates the dummy data DD2 according to the base pattern. Specifically, the memory control circuit unit 104 (or the memory management circuit 202) repeatedly copies the base pattern and combines the base patterns to form the dummy data DD2 having the data length of 224 bytes, such that the data length of the data FD2 formed in this manner meets the predetermined condition.

Figure 12:
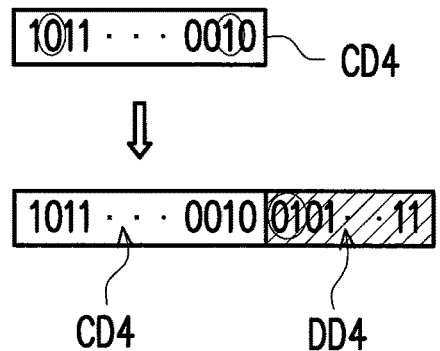
FIG. 12 is a flowchart illustrating a method for generating the dummy data according to another exemplary embodiment.

It should be noted that the way of selecting the data bits of the dummy data may vary according to settings of each manufacturer, which is not limited in the present invention. In other words, the number and positions of the selected data bits in the compressed data may vary with the settings of each manufacturer. For example, the number of the selected data bits may be 1 or more, and the position of each selected data bit may be the data bit in any position in the compressed data. In another exemplary embodiment, the memory control circuit unit 104 (or the memory management circuit 202) retrieves the content of the last or more bits in the compressed data to generate the dummy data. Alternatively, in yet another exemplary embodiment, the memory control circuit unit 104 (or the memory management circuit 202) may also select the second data bit, i.e., "0" and the second last data bit, i.e., "1", of the data CD4 as a base pattern (i.e., "01"), form dummy data DD4 (i.e., "0101 . . . 01") by means of repeatedly copying the base pattern and pad the data CD4 with the dummy data DD4 to generate data (as shown in FIG. 12).

Figure 13:
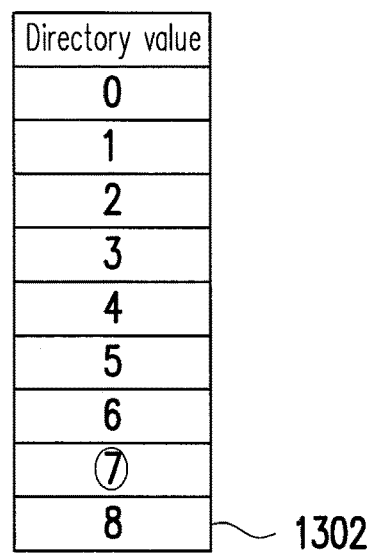
FIG. 13 is a schematic diagram illustrating a bit-padding table according to an exemplary embodiment.
Figure 14:
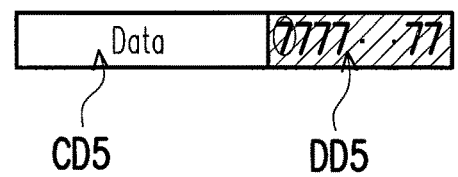
FIG. 14 is a schematic diagram illustrating a method for generating the dummy data according to another exemplary embodiment.

In addition, referring to FIG. 13 and FIG. 14, in another exemplary embodiment, the predetermined rule refers to the memory control circuit unit 104 (or the memory management circuit 202) recording a bit-padding table 1302 in the rewritable non-volatile memory module 106 or the buffer memory 210 and generating dummy data according to the recorded bit-padding table 1302. The bit-padding table 1302 stores a plurality of directory values, and a manufacturer may set the bit-padding table 1302 and the directory values stored therein according to the manufacturer's demand. For example, when being about to generate dummy data to add the dummy data to data CD5 to form data having a data length meeting the predetermined condition, the memory control circuit unit 104 (or the memory management circuit 202) may sequentially select a directory value in the bit-padding table 1302 to serve it as a base pattern to form dummy data. As shown in FIG. 13, if a directory value selected by the memory control circuit unit 104 (or the memory management circuit 202) is "7", referring to FIG. 14, the memory control circuit unit 104 (or the memory management circuit 202) may copy the selected directory value to form dummy data DD5 having data bits of "7777 . . . 77".

It is to be mentioned that next time when being about to generate dummy data, the memory control circuit unit 104 (or the memory management circuit 202) may select a directory value sorted after the previously selected directory value (e.g., "8" in FIG. 13) from the bit-padding table 1302 according to the previously selected directory value to form dummy data. In this way, each generated dummy data vary with each directory value sequentially selected from the bit-padding table 1302. It should be noted that the directory values of the bit-padding table 1302 are not limited by the present invention. For example, the number of the directory values in the bit-padding table 1302 may be less or more, and the directory values in the bit-padding table 1302 may various types of values, such as 8-binary, 16-binary and so on, or each directory value may be a 1-digit or multi-digit value.

Additionally, in another exemplary embodiment, the predetermined rule refers that the memory control circuit unit 104 (or the memory management circuit 202) may first identify an erase count of the physical erasing unit selected for writing data before the dummy data is generated, input the erase count into a random number generator function to generate a base pattern for generating dummy data and then generate dummy data according to the base pattern.

For example, the memory control circuit unit 104 (or the memory management circuit 202) may identify an erase count of the physical erasing unit selected for writing data as '777' and input '777' into a Seed function (e.g., the Srand( ) function in C language), such that thereafter, a value generated by using a random function (e.g., the rand( ) function in C language) becomes more random because of the erase count of the physical erasing unit. Then, the memory control circuit unit 104 (or the memory management circuit 202) may use the value generated by using the random function as a base pattern to generate dummy data. For example, when the randomly generated value is "100111", the memory control circuit unit 104 (or the memory management circuit 202) may use "100111" as the base pattern of the dummy data and copy the base pattern to generate dummy data containing data bits of "100111 . . . 100111". In other words, the dummy data contained in each compressed data stored in different physical erasing units dynamically changes correspondingly with the erase counts of the physical erasing units.

Further, in another exemplary embodiment, the predetermined rule refers that the memory control circuit unit 104 (or the memory management circuit 202) may also generate dummy data simultaneously according to a combination of at least two of the erase count of the physical erasing unit selected for writing data, the value in the bit-padding table, and the data bits content of the compressed data. For example, the memory control circuit unit 104 (or the memory management circuit 202) may add a directory value from the bit-padding table 1302 illustrated in FIG. 13 with an erase count of the physical erasing unit selected for storing the compressed data (i.e., the second data), and serve this value as the base pattern to form dummy data. It should be noted that the present invention is not intent to limit the calculation manner of the random function, and the persons of this art can design a random function and seeds used for generating the random value based on the teachings from the exemplary embodiments of the invention.

Figure 15:
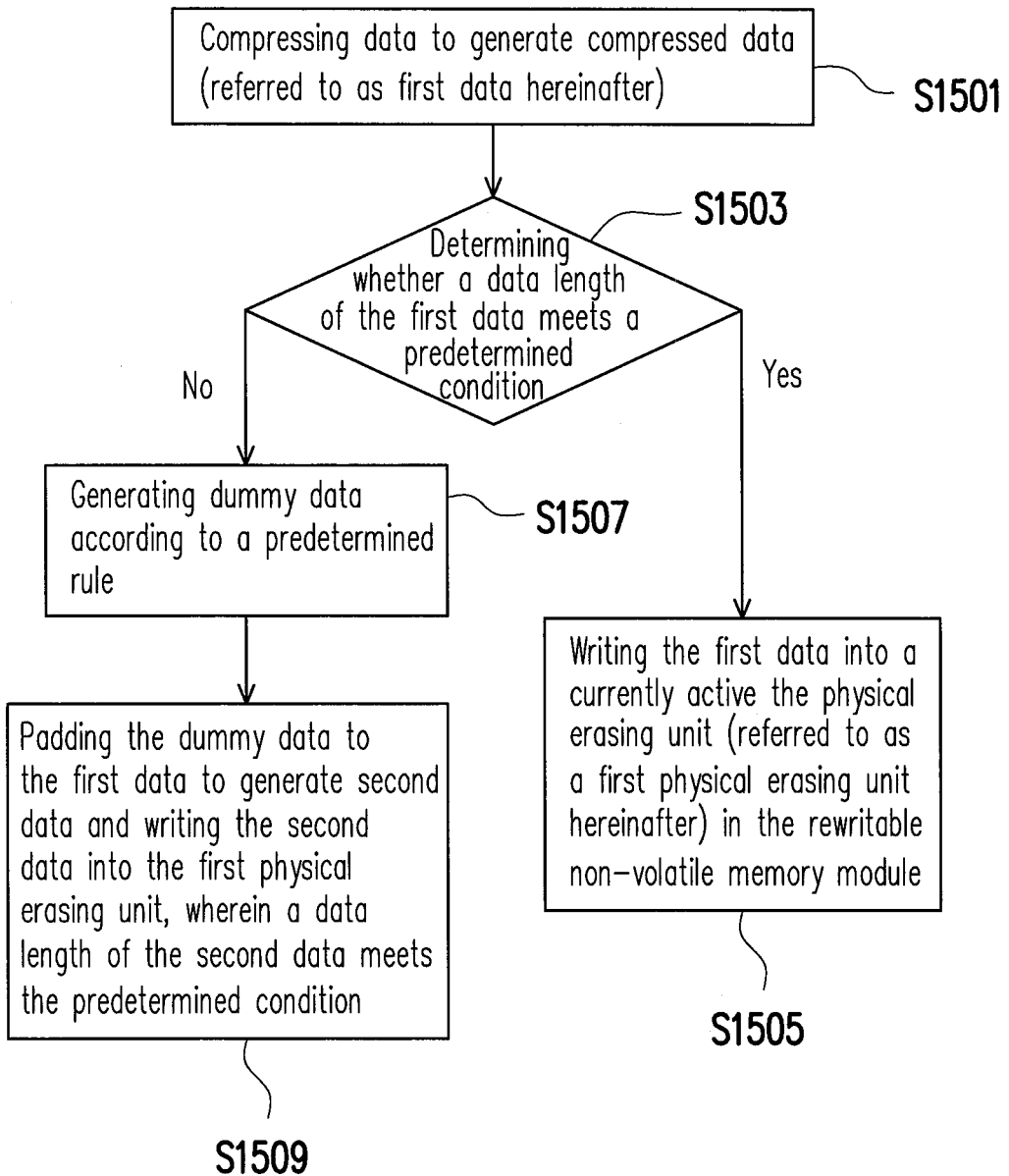
FIG. 15 is a flowchart illustrating a data writing method according to an exemplary embodiment.

FIG. 15 is a flowchart illustrating a data writing method according to an exemplary embodiment.

Referring to FIG. 15, in step S1501, the memory control circuit unit 104 (or the memory management circuit 202) instructs the data compression/decompression circuit 208 to compress data to generate compressed data (referred to as first data hereinafter). In step S1503, the memory control circuit unit 104 (or the memory management circuit 202) determines whether a data length of the first data meets a predetermined condition. If, in step S1503, the memory control circuit unit 104 (or the memory management circuit 202) determines that the data length of the first data meets the predetermined condition, in step S1505, the memory control circuit unit 104 (or the memory management circuit 202) writes the first data into a currently active physical erasing unit (referred to as a first physical erasing unit) in the rewritable non-volatile memory module 106.

If, in step S1503, the memory control circuit unit 104 (or the memory management circuit 202) determines that the data length of the first data does not meet the predetermined condition, in step S1507, the memory control circuit unit 104 (or the memory management circuit 202) generates dummy data according to a predetermined rule, and in step S1509, the memory control circuit unit 104 (or the memory management circuit 202) pads the first data with the dummy data to generate second data and writes the second data into the first physical erasing unit. A data length of the second data meets the predetermined condition.

In light of the foregoing, in the data writing method, the memory control circuit unit and the memory storage apparatus provided by the exemplary embodiments, compressed data in a fixed multiple of a data length can be generated, so as to increase data writing efficiency and convenience of data management of the memory storage apparatus. Meanwhile, based on the data writing method of the exemplary embodiments, the memory storage apparatus can further dynamically change the data bits of the dummy data which is added to the compressed data each time when the compressed data is generated. Accordingly, when each compressed data is stored, the units to which the memory storage apparatus writes data do not store the same dummy data, such that the memory storage apparatus can achieve an effect of averaging the loss to enhance the endurance of the memory storage apparatus and prolong the life span of the memory storage apparatus. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data writing method, for a rewritable non-volatile memory module, wherein the rewritable non-volatile memory module comprises a plurality of physical erasing units, and each of the physical erasing units comprises a plurality of physical programming units, the data writing method comprising:
    compressing data to generate first data;
    determining whether a data length of the first data meets a predetermined condition;
    if the data length of the first data meets the predetermined condition, writing the first data into a first physical erasing unit among the physical erasing units;
    if the data length of the first data does not meet the predetermined condition, identifying a plurality of data bits in the first data and selecting a portion of the data bits of the first compressed data, generating the dummy data by repeatedly storing the selected portion of the data bits and a randomly generated value by randomizing an erase count of the physical erasing unit selected for writing data in sequence to form the dummy data, padding the first data with the dummy data to generate second data, and writing the second data into the first physical erasing unit, wherein a data length of the second data meets the predetermined condition.

2. The data writing method according to claim 1, wherein the step of determining whether the data length of the first data meets the predetermined condition comprises:
    determining whether the data length of the first data equals to an integer multiple of a predetermined length; and
    if the data length of the first data equals to the integer multiple of the predetermined length, determining that the data length of the first data meets the predetermined condition.

3. The data writing method according to claim 1, wherein data bits of the dummy data dynamically change each time the data is compressed, wherein the dummy data stored in different physical erasing units for different compressed data are different.

4. A memory control circuit unit, for controlling a rewritable non-volatile memory, wherein the rewritable non-volatile memory module comprises a plurality physical erasing units, and each of the physical erasing units comprises a plurality of physical programming units, the memory control circuit unit comprising:
    a host interface configured to be coupled to a host system;
    a memory interface configured to be coupled to the rewritable non-volatile memory module;
    a memory management circuit coupled to the host interface and the memory interface; and
    a data compression/decompression circuit coupled to the memory management circuit, wherein the memory management circuit is configured to instruct the data compression/decompression circuit to compress data to generate first data,
    wherein the memory management circuit is further configured to determine whether a data length of the first data meets a predetermined condition,
    wherein if the data length of the first data meets the predetermined condition, the memory management circuit is further configured to transmit a command sequence to the rewritable non-volatile memory module to instruct writing the first data into a first physical erasing unit among the physical erasing units, and
    wherein if the data length of the first data does not meet the predetermined condition, the memory management circuit is further configured to identify and select a plurality of data bits in the first data, generate dummy data according to a predetermined rule by repeatedly storing the selected portion of the data bits and randomly generating value by randomizing an erase count of the physical erasing unit selected for writing data in sequence to form the dummy data, pad the first data with the dummy data to generate second data and transmit the command sequence to the rewritable non-volatile memory module to instruct to write the second data into the first physical erasing unit, wherein a data length of the second data meets the predetermined condition.

5. The memory control circuit unit according to claim 4, wherein in the operation of determining whether the data length of the first data meets the predetermined condition,
    the memory management circuit determines whether the data length of the first data equals to an integer multiple of a predetermined length and if the data length of the first data equals to the integer multiple of the predetermined length, determines that the data length of the first data meets the predetermined condition.

6. The memory control circuit unit according to claim 4, wherein the memory management circuit dynamically changes data bits of the dummy data each time the data is compressed, and the dummy data stored in different physical erasing units for different compressed data are different.

7. A memory storage apparatus, comprising:
    a connection interface unit configured to be coupled to a host system;

a rewritable non-volatile memory module having a plurality of physical erasing units, wherein each of the physical erasing units has a plurality of physical programming units; and a memory control circuit unit coupled to the connection interface unit and the rewritable non-volatile memory module, wherein the memory control circuit unit is configured to compress data to generate first data, wherein the memory control circuit unit is further configured to determine whether a data length of the first data meets a predetermined condition, wherein if the data length of the first data meets the predetermined condition, the memory control circuit unit is further configured to transmit a command sequence to the rewritable non-volatile memory module to instruct to write the first data into a first physical erasing unit among the physical erasing units, and wherein if the data length of the first data does not meet the predetermined condition, the memory control circuit unit is configured to identify and select a plurality of data bits in the first data, generate dummy data according to a predetermined rule by repeatedly storing the selected portion of the data bits and randomly generating value by randomizing an erase count of the physical erasing unit selected for writing data in sequence to form the dummy data, pad the first data with the dummy data to generate second data and transmit the command sequence to the rewritable non-volatile memory module to instruct to write the second data into the first physical erasing unit, wherein a data length of the second data meets the predetermined condition.

8. The memory storage apparatus according to claim 7, wherein in the operation of the determining whether the data length of the first data meets the predetermined condition, the memory control circuit unit determines whether the data length of the first data equals to an integer multiple of a predetermined length and if the data length of the first data equals to the integer multiple of the predetermined length, determines that the data length of the first data meets the predetermined condition.

9. The memory storage apparatus according to claim 7, wherein the memory control circuit unit dynamically changes data bits of the dummy data each time the data is compressed, and the dummy data stored in different physical erasing units for different compressed data are different.

* * * * *